United States Patent
Hachiya et al.

(10) Patent No.: US 9,480,159 B2
(45) Date of Patent: Oct. 25, 2016

(54) COIL-INTEGRATED PRINTED CIRCUIT BOARD AND MAGNETIC DEVICE

(71) Applicants: Koji Hachiya, Aichi (JP); Tomoyoshi Kobayashi, Aichi (JP); Koichi Nakabayashi, Kyoto (JP)

(72) Inventors: Koji Hachiya, Aichi (JP); Tomoyoshi Kobayashi, Aichi (JP); Koichi Nakabayashi, Kyoto (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 83 days.

(21) Appl. No.: 14/520,481

(22) Filed: Oct. 22, 2014

(65) Prior Publication Data

US 2015/0116963 A1 Apr. 30, 2015

(30) Foreign Application Priority Data

Oct. 24, 2013 (JP) .................................. 2013-220747

(51) Int. Cl.
  *H05K 1/16* (2006.01)
  *H05K 1/18* (2006.01)

(52) U.S. Cl.
  CPC ............... *H05K 1/165* (2013.01); *H05K 1/181* (2013.01); *H05K 2201/0355* (2013.01); *H05K 2201/0391* (2013.01); *H05K 2201/086* (2013.01); *H05K 2201/09063* (2013.01)

(58) Field of Classification Search
  CPC ... H05K 1/165; H05K 1/181; H01F 27/2804
  USPC ......... 361/704, 707, 709, 760, 761; 336/200
  See application file for complete search history.

(56) References Cited

U.S. PATENT DOCUMENTS

| 5,929,733 A | 7/1999 | Anzawa et al. |
| 8,089,331 B2 * | 1/2012 | Jacobson ............ H01F 27/2804 336/200 |
| 8,686,823 B2 | 4/2014 | Asano et al. |

FOREIGN PATENT DOCUMENTS

| JP | H07-038262 A | 2/1995 |
| JP | H07-086755 A | 3/1995 |
| JP | 2008177516 A | 7/2008 |
| JP | 2010109309 A | 5/2010 |
| JP | 2011029313 A | 2/2011 |
| JP | 2012-156461 A | 8/2012 |

* cited by examiner

*Primary Examiner* — Jeremy C Norris
*Assistant Examiner* — Ahmad D Barnes
(74) *Attorney, Agent, or Firm* — Osha Liang LLP

(57) ABSTRACT

A coil-integrated printed circuit board includes: a first outer layer which includes a first outer thick electric conductor made of a thick metallic foil and a first outer thin electric conductor made of a thin metallic foil having a thickness smaller than that of the first outer thick electric conductor, and which is exposed to an outside; and a first inner layer which includes an inner thick electric conductor made of a thick metallic foil, and which is not exposed to the outside. Coil patterns are respectively formed by the first outer thick electric conductor and the inner thick electric conductor. A first electronic component is surface-mounted on the first outer thin electric conductor provided on the outer layer.

5 Claims, 9 Drawing Sheets

TOP SURFACE LAYER L1

INNER LAYER L2

INNER LAYER L3

BACK SURFACE LAYER L4

X-X CROSS SECTION

Y-Y CROSS SECTION

COIL-INTEGRATED PRINTED CIRCUIT BOARD AND MAGNETIC DEVICE

CROSS-REFERENCE TO RELATED APPLICATIONS

This application claims priority from Japanese Patent Application No. 2013-220747 filed on Oct. 24, 2013, the entire contents of which are incorporated herein by reference.

FIELD

One or more embodiments of the present invention relate to a coil-integrated printed circuit board on which a coil pattern of an electric conductor is formed, and to a magnetic device provided with the printed circuit board.

BACKGROUND

There is a switching power supply apparatus such as a direct current to direct current converter (DC-DC converter) that converts a high voltage direct current into an alternating current by using a switching operation and then converts the alternating current into a low voltage direct current. A magnetic device such as a choke coil or a transformer is used in the switching power supply apparatus.

For example, JP-A-7-38262, JP-A-7-86755, JP-A-2010-109309, JP-A-2011-29313, JP-A-2012-156461 and JP-A-2008-177516 disclose a coil-integrated printed circuit board on which a coil pattern made of an electric conductor is formed as a coil winding wire, and a magnetic device provided with the board.

The coil pattern is made of a metallic foil having electric conductivity, for example, a copper foil. Similarly, each of the electric conductors such as other wiring patterns, a pad or the like of the board is made of a metallic foil. The coil pattern includes an outer layer that is exposed to the outside of the board, and an inner layer that is not exposed to the outside.

In JP-A-7-38262, JP-A-7-86755 and JP-A-2012-156461, a core made of a magnetic material passes through the board. The coil pattern is formed on predetermined layers of the board so as to be wound around the core.

In JP-A-2011-29313 and JP-A-2012-156461, a thick electric conductor board is used in which the electric conductor of the coil pattern or the like has a thickness greater than that of a typical electric conductor provided on the board so as to allow a large current to flow therethrough.

In JP-A-7-38262, JP-A-7-86755 and JP-A-2010-109309, the respective coil patterns of different layers are connected to each other via a through hole or a copper pin.

In JP-A-7-38262, JP-A-7-86755, JP-A-2010-109309 and JP-A-2011-29313, other electronic components are mounted in a region that is separate from the coil pattern on a top surface layer of the board, and other electrical circuits are formed.

In JP-A-2008-177516, the board includes a pair of insulating layers and a magnetic layer that is interposed between the insulating layers. The coil pattern is formed on the magnetic layer.

SUMMARY

In a case where the coil patterns are formed on a plurality of layers of the board so as to obtain a predetermined number of coil turns, when a current flows through the coil patterns, heat is generated from each of the coil patterns, and the board is likely to increase in temperature. In particular, since a large current flows through the coil pattern in the magnetic device that is used in the DC-DC converter, the amount of heat generated from the coil pattern increases, and the board increases in temperature. When the board increases excessively in temperature, there is a problem in that the characteristics of the magnetic device may change or the performance may deteriorate, and there is a problem in that the electronic components such as an IC chip mounted on the same board may falsely operate, or may be damaged.

When the coil pattern increases in width or thickness, and thus increases in cross-sectional area, the amount of heat generated from the coil pattern is suppressed to some extent. However, since it is necessary to limit the width of the coil pattern to a certain size when the coil pattern is formed in a limited region (area) of the board, the degree of freedom in the width of the coil pattern decreases.

For example, as illustrated in FIGS. 9A and 9B, in a printed circuit board B, respective skirt portions Ds of electric conductors Da and Db increase in width Wa and Wb (Wa>Wb), respectively, to the extent that the electric conductors Da and Db of the pattern and the like increase in thickness ta and tb (ta>tb), respectively, and thus the printed circuit board B decreases in mounting density. For this reason, for example, when the magnetic device and other electronic components are provided on the same board as in the DC-DC converter, and the electric conductor of the board increases in thickness, it is not possible to mount the electronic components at a high density, and the board and the apparatus increase in size.

An object of one or more embodiments of the present invention is to provide a coil-integrated printed circuit board which can obtain a predetermined number of coil turns and suppress generation of heat from a coil, and on which an electronic component can be mounted at a high density, and a magnetic device provided with the printed circuit board.

According to one or more embodiments of the present invention, there is provided a coil-integrated printed circuit board including: a first outer layer which includes a first outer thick electric conductor made of a thick metallic foil and a first outer thin electric conductor made of a thin metallic foil having a thickness smaller than that of the first outer thick electric conductor, and which is exposed to an outside; and a first inner layer which includes an inner thick electric conductor made of a thick metallic foil, and which is not exposed to the outside. Coil patterns are respectively formed by the first outer thick electric conductor and the inner thick electric conductor. A first electronic component is surface-mounted on the first outer thin electric conductor provided on the outer layer.

According to one or more embodiments of the present invention, there is provided a magnetic device which includes the coil-integrated printed circuit board and a core which is made of a magnetic material and which passes through the coil-integrated printed circuit board. The coil patterns formed in the coil-integrated printed circuit board are wound around the core.

In this configuration, the thick electric conductor and the thin electric conductor may be mixed up on the outer layer of the coil-integrated printed circuit board, and the inner layer may be provided with the thick electric conductor. For this reason, the coil patterns, each having a large thickness and a large cross-sectional area, are respectively formed by the thick electric conductors which are respectively provided on the outer and inner layers, and thus it is possible to obtain a predetermined number of coil turns while suppressing generation of heat from the coil. It is possible to mount the electronic component on the thin electric conductor of the outer layer at a high density.

The coil-integrated printed circuit board according to one or more embodiments of the present invention may adopt the following configuration. The coil-integrated printed circuit board may further include a second outer layer which includes a second outer thick electric conductor made of a thick metallic foil and a second outer thin electric conductor made of a thin metallic foil having a thickness smaller than that of the second outer thick electric conductor, and which is exposed to an outside. The first outer layer may define one of a top surface and a back surface of the coil-integrated printed circuit board, and the second outer layer may define the other of the top surface and the back surface. The first inner layer may be disposed between the first outer layer and the second outer layer, and may include the inner thick electric conductor without a thin electric conductor made of a thin metallic foil. The coil patterns may be respectively formed by the first outer thick electric conductor, the second outer thick electric conductor and the inner thick electric conductor. A second electronic component may be surface-mounted on the second outer thin electric conductor.

In the coil-integrated printed circuit board according to one or more embodiments of the present invention, the coil-integrated printed circuit board may further include a second inner layer disposed between the first outer layer and the second outer layer, and which includes an inner thin electric conductor without a thick electric conductor made of a thick metallic foil. A wiring pattern may be formed by the inner thin electric conductor.

According to one or more embodiments of the present invention, it is possible to provide a coil-integrated printed circuit board which can obtain a predetermined number of coil turns and suppress generation of heat from a coil, and on which an electronic component can be mounted at a high density, and a magnetic device provided with the circuit board.

DETAILED DESCRIPTION

Hereinafter, an embodiment of the present invention will be described with reference to the accompanying drawings. In each of the drawings, the same reference signs will be respectively assigned to the same parts or the corresponding parts. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 1:
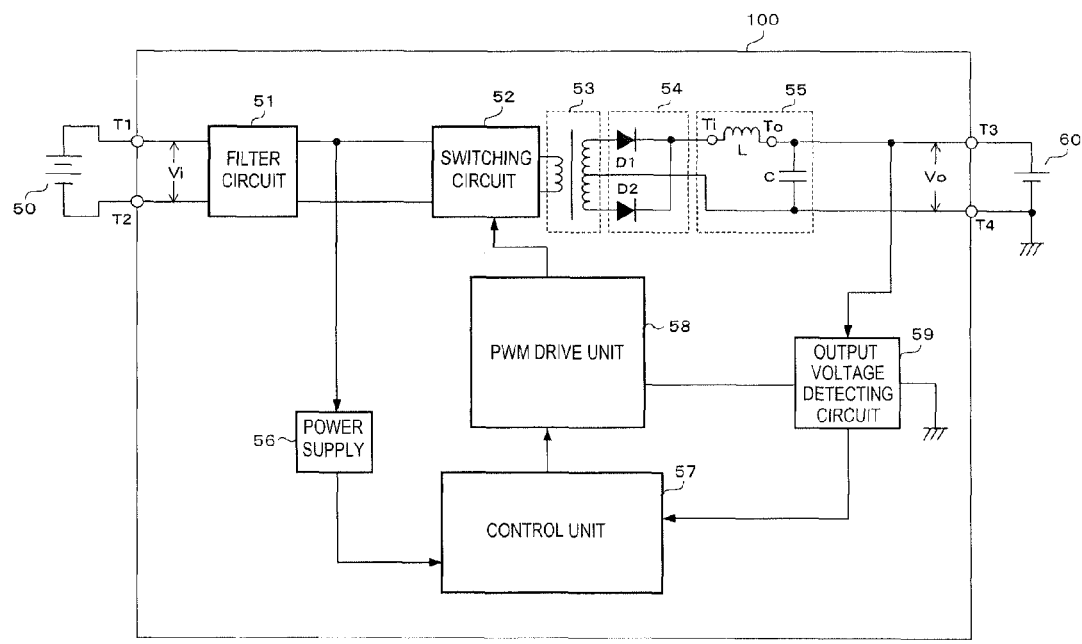
FIG. 1 is a configuration view of a switching power supply apparatus.

FIG. 1 is a configuration view of a switching power supply apparatus 100. The switching power supply apparatus 100 is a DC-DC converter for an electric vehicle (or a hybrid vehicle), and converts a high voltage direct current into an alternating current by using a switching operation, and then converts the alternating current into a low voltage direct current. The detailed description of the switching power supply apparatus 100 will be given below.

A high voltage battery 50 is connected to input terminals T1 and T2 of the switching power supply apparatus 100. For example, the voltage of the high voltage battery 50 is from DC 220 V to DC 400 V. A filter circuit 51 removes noise from a direct current voltage Vi that is input from the high voltage battery 50 to the input terminals T1 and T2, and then the direct current voltage Vi is sent to a switching circuit 52.

For example, the switching circuit 52 is a well-known circuit having a field effect transistor (FET). In the switching circuit 52, the FET is turned on and off based on a pulse width modulation (PWM) signal from a PWM drive unit 58, and the direct current voltage is switched. Accordingly, the direct current voltage is converted into a high frequency pulse voltage.

The pulse voltage is sent to a rectifier circuit 54 via a transformer 53. The rectifier circuit 54 rectifies the pulse voltage by using a pair of diodes D1 and D2. The voltage rectified by the rectifier circuit 54 is input to a smoothing circuit 55. The smoothing circuit 55 smooths the rectified voltage by using the filter action of a choke coil L and a condenser C, and outputs a low direct current voltage to output terminals T3 and T4. For example, a low voltage battery 60 connected to the output terminals T3 and T4 is charged to a DC 12V with the direct current voltage. The low voltage battery 60 supplies a direct current voltage to various on-vehicle electrical components that are not illustrated.

An output voltage Vo of the smoothing circuit 55 is detected by an output voltage detecting circuit 59, and then is output to the PWM drive unit 58. The PWM drive unit 58 calculates the duty ratio of a PWM signal based on the output voltage Vo, generates a PWM signal corresponding to the duty ratio, and outputs the PWM signal to a gate of the FET of the switching circuit 52. In this manner, feedback control is performed so as to maintain the output voltage constant.

A control unit 57 controls the operation of the PWM drive unit 58. A power supply 56 is connected to an output side of the filter circuit 51. The power supply 56 steps down a voltage from the high voltage battery 50, and supplies a power supply voltage (for example, DC 12 V) to the control unit 57.

The above-mentioned parts of the switching power supply apparatus 100 are mounted on a board 3 that is described later. A magnetic device 1 is used as the choke coil L of the smoothing circuit 55, and will be described later. For example, a large current of DC 150 A flows through the choke coil L. An input electrode Ti is provided at one end of the choke coil L so as to input electrical power, and an output electrode To is provided on the other end of the choke coil L so as to output the electrical power.

Subsequently, the structure of the magnetic device 1 will be described with reference to FIGS. 2 to 8.

Figure 2:
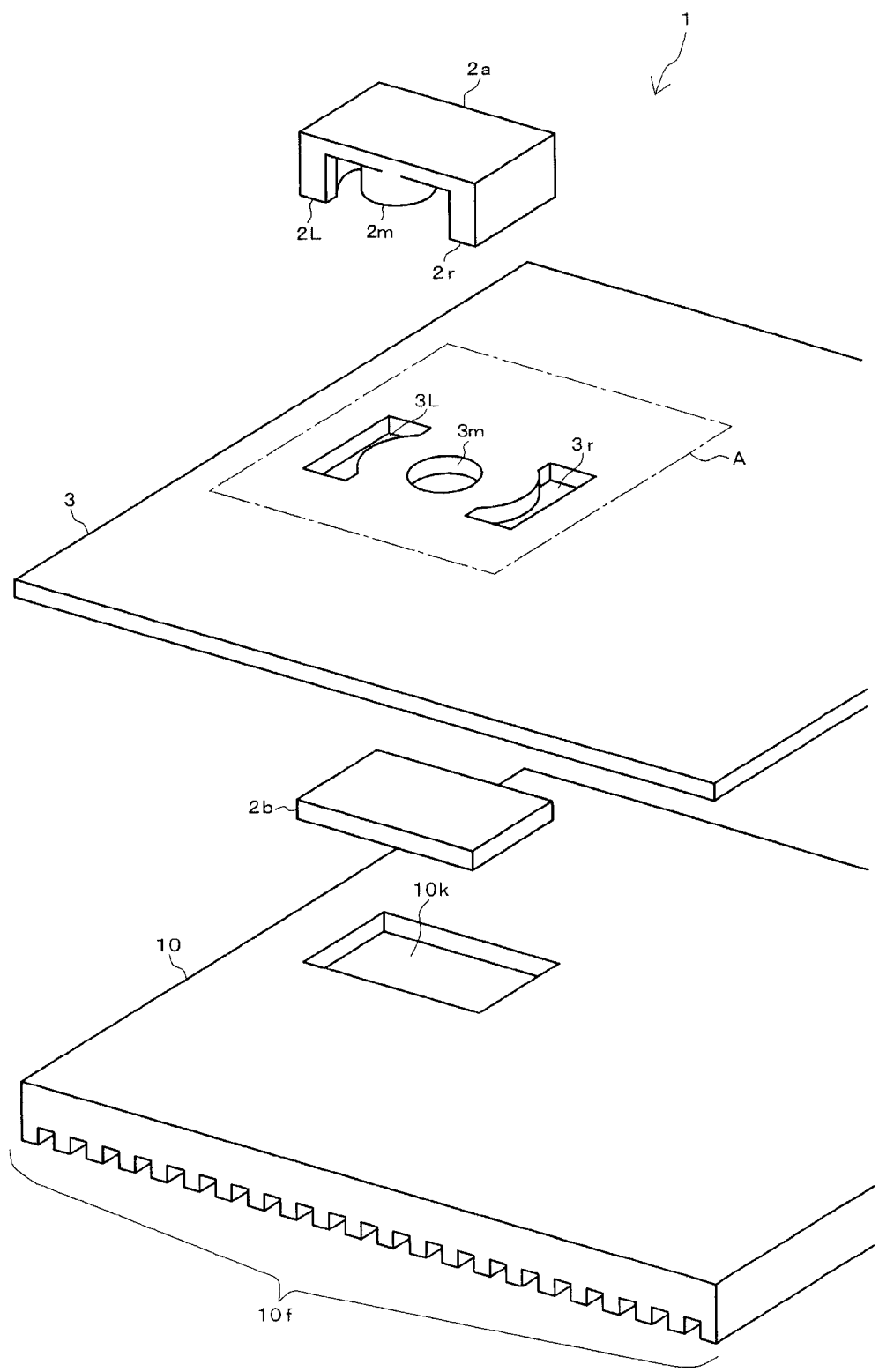
FIG. 2 is an exploded perspective view of the magnetic device according to an embodiment of the present invention.
Figure 3:
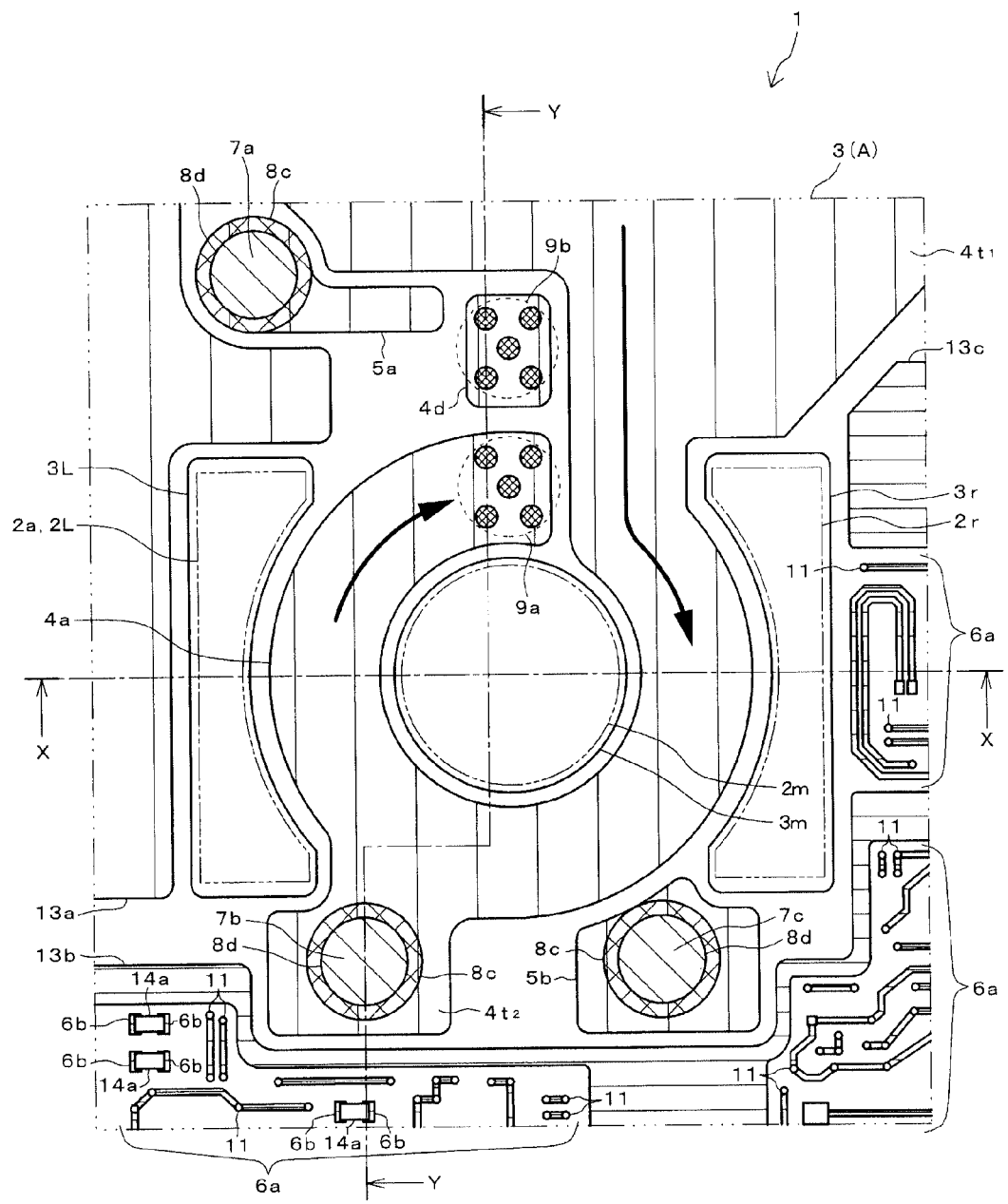
FIG. 3 is a plan view of a top surface layer of portion A of a coil-integrated printed circuit board illustrated in FIG. 2.
Figure 4:
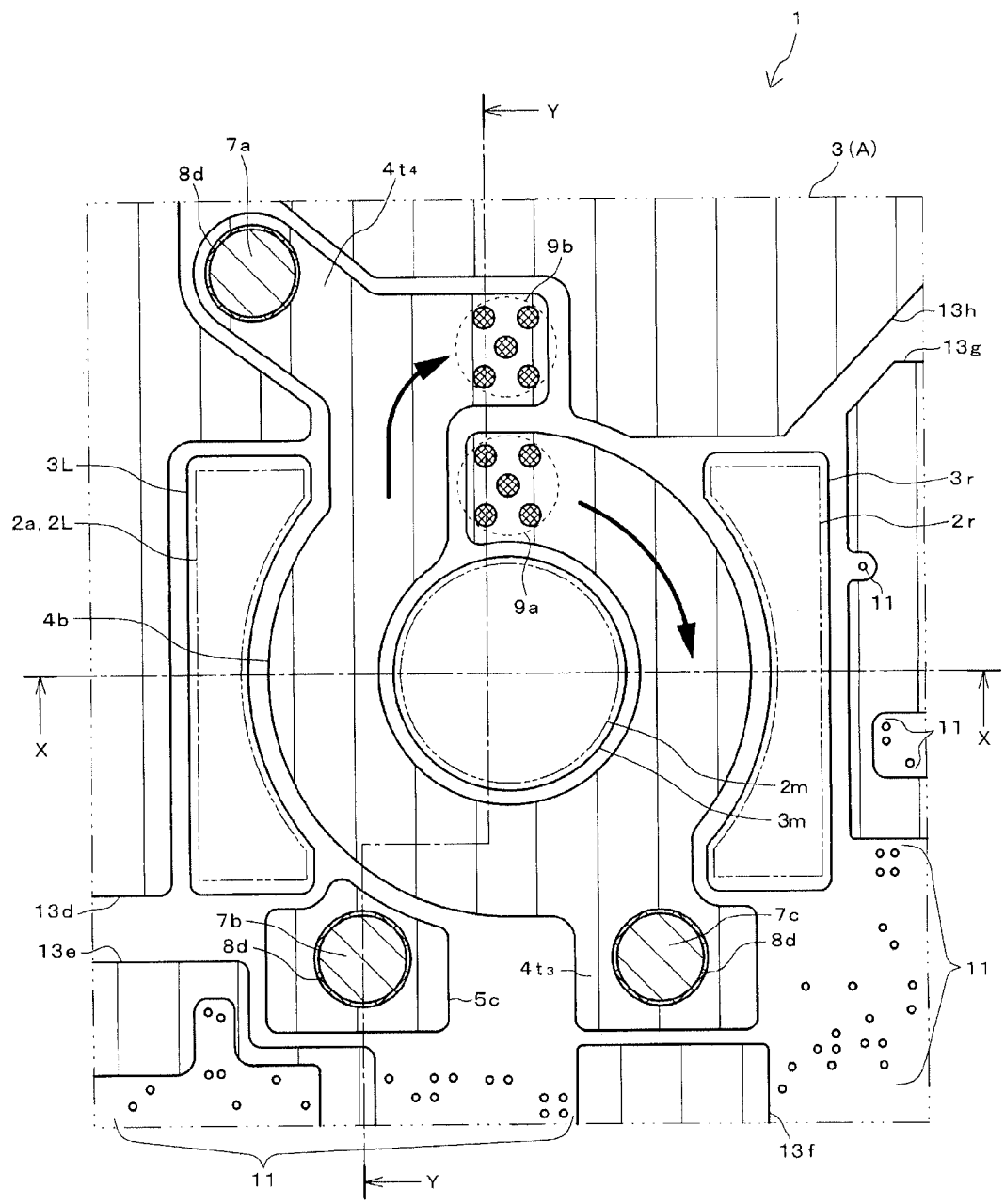
FIG. 4 is a plan view of a first inner layer in portion A of the coil-integrated printed circuit board illustrated in FIG. 2.
Figure 5:
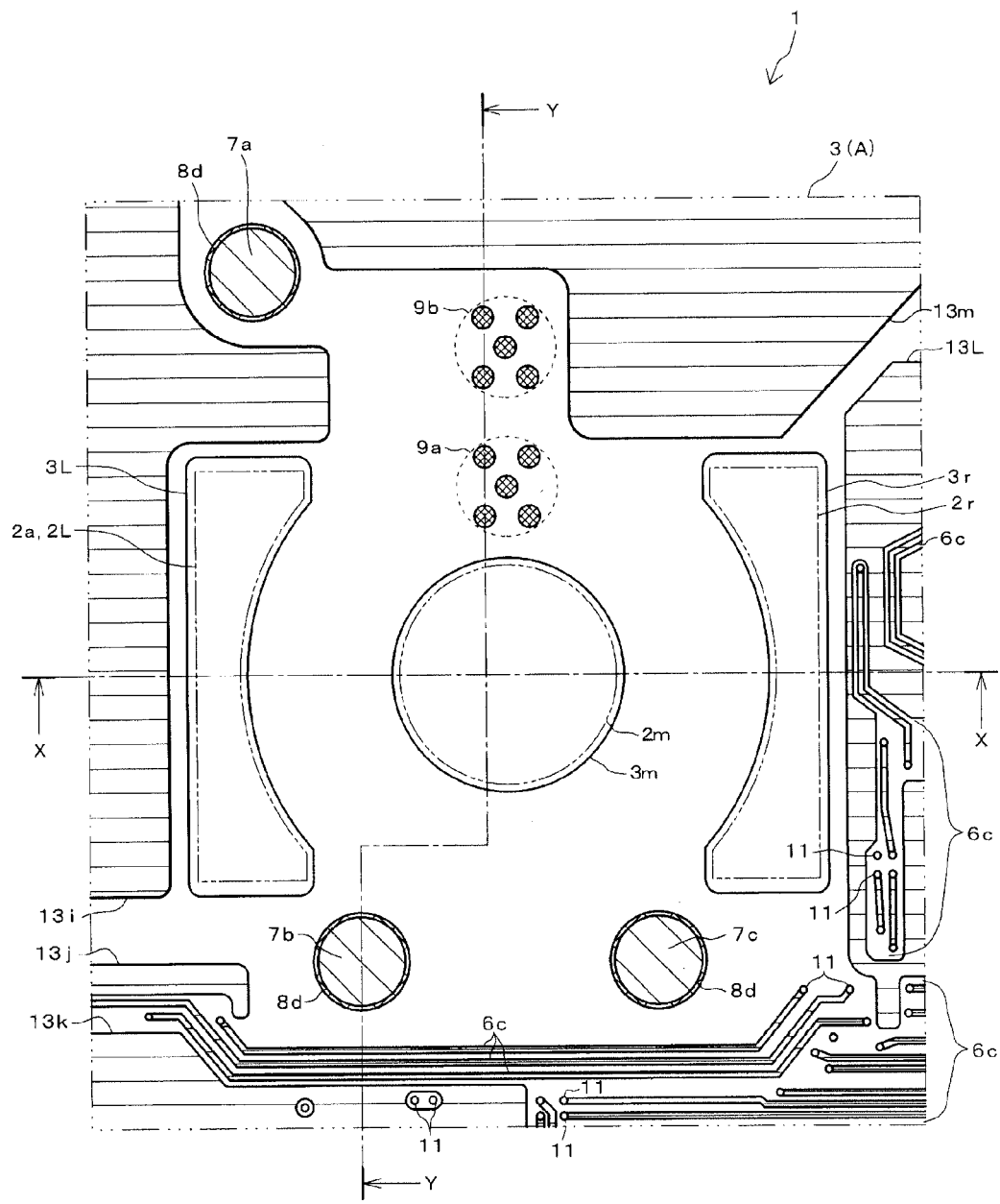
FIG. 5 is a plan view of a second inner layer in portion A of the coil-integrated printed circuit board illustrated in FIG. 2.
Figure 6:
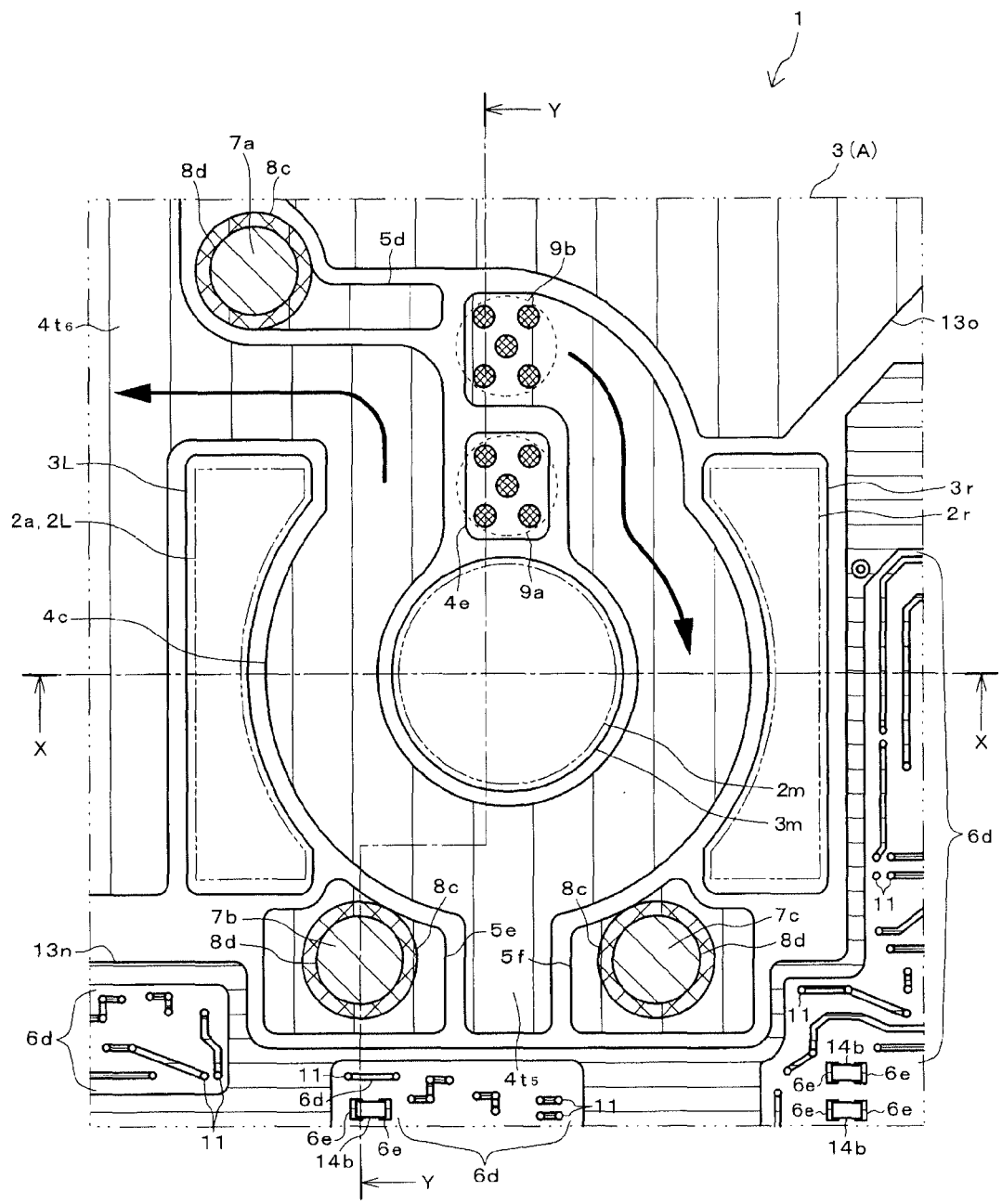
FIG. 6 is a plan view of a back surface layer in portion A of the coil-integrated printed circuit board illustrated in FIG. 2.
Figure 7:
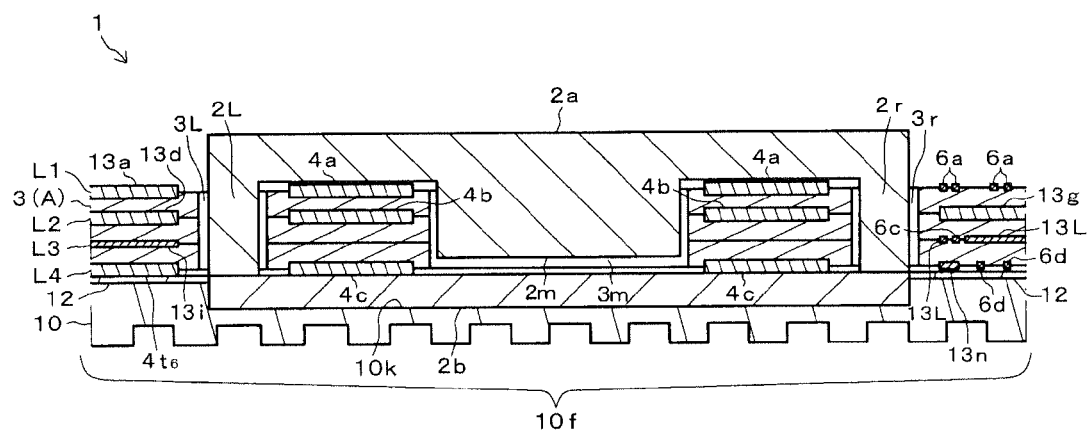
FIG. 7 is a cross-sectional view taken along line X-X in each of FIGS. 3 to 6.
Figure 8:
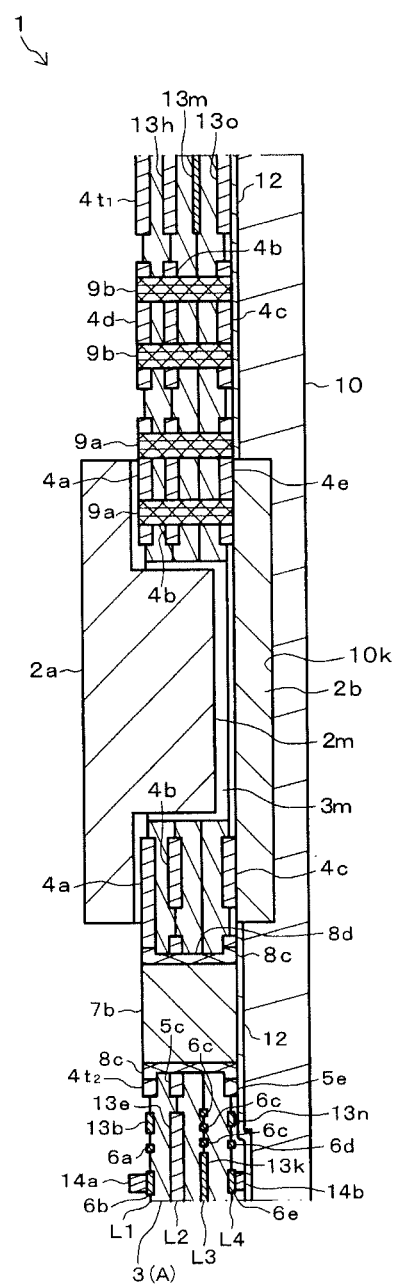
FIG. 8 is a cross-sectional view taken along line Y-Y in each of FIGS. 3 to 6.
Figure 9A:
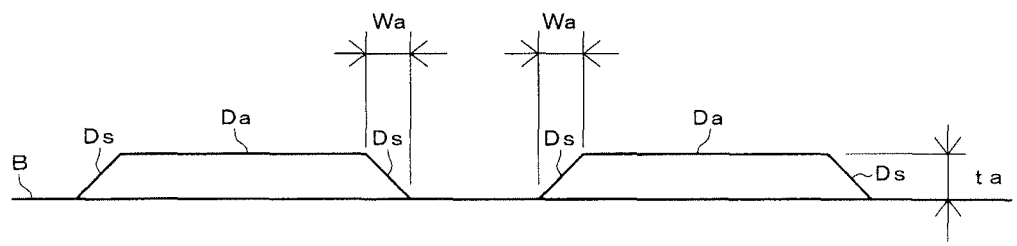
FIGS. 9A and 9B are views illustrating an example of an electric conductor on the printed circuit board.
Figure 9B:
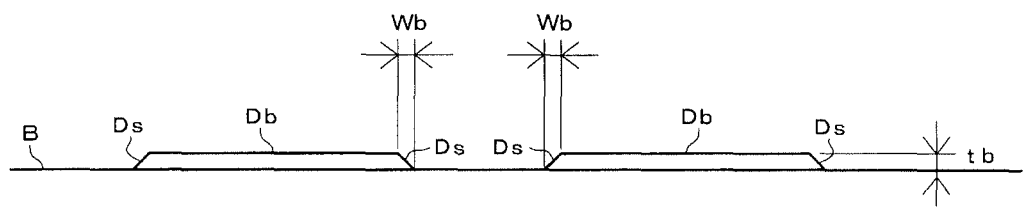

FIG. 2 is an exploded perspective view of the magnetic device 1. FIGS. 3 to 6 are the respective plan views of layers L1 to L4 in portion A of the coil-integrated printed circuit board 3 (hereinafter, simply referred to as the "board 3") illustrated in FIG. 2. Specifically, FIG. 3 is a plan view of the top surface layer L1, FIG. 4 is a plan view of the first inner layer L2, FIG. 5 is a plan view of the second inner layer L3, and FIG. 6 is a plan view of the back surface layer L4. FIGS. 7 and 8 are cross-sectional views of the magnetic device 1. Specifically, FIG. 7 illustrates a cross section taken along line X-X in each of FIGS. 3 to 6, and FIG. 8 illustrates a cross section taken along line Y-Y.

As illustrated in FIGS. 2 and 7, two cores 2a and 2b are provided in a pair. The upper core 2a has an E-shaped cross section, and the lower core 2b has an I-shaped cross section. Each of the cores 2a and 2b is made of a magnetic material such as ferrite metal or amorphous metal.

The upper core 2a has three projections 2m, 2L, and 2r which protrude downwards. As illustrated in FIGS. 3 to 7, the projections 2m, 2L, and 2r are disposed linearly. As illustrated in FIGS. 2 and 7, the right projection 2r and the left projection 2L protrude downwards further than the center projection 2m.

As illustrated in FIG. 7, the cores 2a and 2b are combined together while the respective lower ends of the right projection 2r and the left projection 2L of the upper core 2a are in close contact with an upper surface of the lower core 2b. In this state, a gap of a predetermined size is provided between the center projection 2m of the upper core 2a and the upper surface of the lower core 2b so as to improve DC superimposition characteristics. Accordingly, even when a large current flows through the magnetic device 1 (the choke coil L), it is possible to obtain a predetermined inductance. The cores 2a and 2b are fixed by using fixing means (not illustrated) such as a screw or a metal fitting. The lower core 2b is fitted into a depression 10k (refer to FIG. 2) that is provided on an upper side of a heat sink 10. A fin 10f is provided on a lower side of the heat sink 10. The heat sink 10 is made of metal such as aluminum.

The board 3 is a printed circuit board in which an electric conductor such as a pattern, a pad, or a land is formed by etching in each thin plate-like base layer made of an insulator. The electric conductor is made of a metallic foil such as a copper foil having electric conductivity. In the embodiment, the accompanying drawings do not illustrate a majority of electronic components or electrical circuits on the board 3 other than the magnetic device 1 of the switching power supply apparatus 100 illustrated in FIG. 1. A part of the electronic components or the electrical circuits is illustrated in FIGS. 3, 5, and 6.

As illustrated in FIG. 3, the top surface layer L1 is provided on a top surface (an upper surface in each of FIGS. 2, 7, and 8) of the board 3. As illustrated in FIG. 6, the back surface layer L4 is provided on a back surface (a lower surface in each of FIGS. 2, 7, and 8) of the board 3. As illustrated in FIGS. 7 and 8, the inner layers L2 and L3 illustrated in FIGS. 4 and 5, respectively, are provided between the top surface layer L1 and the back surface layer L4. That is, the board 3 is a multiple layer board having a total of the four layers L1 to L4, the two outer layers L1 and L4 which are exposed to the outside, and the two inner layers L2 and L3 which are not exposed to the outside. The multiple layer board refers to a board having three or more layers. The inner layer L2 is an example of the "first inner layer," and the inner layer L3 is an example of the "second inner layer."

The board 3 is provided with a plurality of opening portions 3m, 3L, and 3r. The opening portion 3m is a circular through hole of a large diameter, and each of the opening portions 3L and 3r is a substantially concave through hole. As illustrated in FIGS. 2 to 7, the center projection 2m of the core 2a is inserted into the one opening portion 3m that is positioned at the center of the board 3. The right projection 2r and the left projection 2L of the core 2a are respectively inserted into the right opening portion 3r and the left opening portion 3L. As illustrated in FIGS. 7 and 8, the heat sink 10 is fixed to the back surface layer L4 of the board 3 by using fixing means (not illustrated) such as a screw. An insulation sheet 12 having heat transfer properties is interposed between the board 3 and the heat sink 10. Since the insulation sheet 12 is flexible, the insulation sheet 12 is in close contact with the board 3 or the heat sink 10 without a gap therebetween.

As illustrated in FIGS. 3 to 8, thick electric conductors (vertical hatched portions in each of FIGS. 3, 4, and 6) are formed on each of the layers L1, L2, and L4 of the board 3, and each of the thick electric conductors is made of a thick metallic foil. Thin electric conductors (horizontal hatched portions in each of FIGS. 3, 5, and 6) are formed in each of the layers L1, L3, and L4 of the board 3, and each of the thin electric conductors is made of a thin metallic foil having a thickness smaller than that of the thick electric conductor. Similarly, the thick and thin electric conductors are formed in portions other than portion A of the board 3.

The board 3 is provided with through holes 8d and through hole groups 9a and 9b which function as electric conductors and pass through the entirety of the board 3 in a thickness direction (refer to FIG. 8). Heat dissipating pins (for example, copper pins) 7a to 7c are respectively embedded into the through holes 8d, each of which has a large diameter. Each of the through hole groups 9a and 9b is configured when a plurality of through holes gather together with a predetermined gap therebetween, and each of the plurality of through holes has a diameter smaller than that of the through hole 8d. A copper plating is applied to a top surface of each of the small through holes, and the inside of the small through hole is filled with copper.

The board 3 is provided with a plurality of small-diameter through holes (a plurality of small-diameter white circular portions illustrated on a right side and a lower side in each of FIGS. 3 to 6, and a reference sign 11 is assigned to only a part of the small-diameter white circular portions for illustrative purposes) that function as electric conductors and pass through the entirety or a part of the board 3 in the thickness direction.

As illustrated in FIG. 3, the thick electric conductors and the thin electric conductors are mixed up on the top surface layer L1 of the board 3. A coil pattern 4a, extension portions $4t_1$ and $4t_2$, a rectangular pattern 4d, heat dissipating patterns 5a and 5b, a solid pattern 13a, a land 8c of the through hole 8d, and the like are respectively formed on the thick electric conductors. A wiring pattern 6a, solid patterns 13b and 13c, a pad 6b, and the like are respectively formed on the thin electric conductors. The solid pattern 13a may be formed on the thin electric conductor, and the solid patterns 13b and 13c may be respectively formed on the thick electric conductors.

In each of the layers of the board, the solid pattern refers to a pattern which is an empty portion to be plated after a pattern wiring process is completed. Each of the solid patterns has a relatively large area, and is used for heat dissipation or an electrical ground connection.

On the top surface layer L1, the coil pattern $4a$, the rectangular pattern $4d$, the heat dissipating patterns $5a$ and $5b$, the solid patterns $13a$ to $13c$, the wiring pattern $6a$, and the pad $6b$ are individually formed, and are electrically connected to each other. The respective top surfaces of the patterns $4a$, $4d$, $5a$, $5b$, $13a$ to $13c$, and $6a$ are processed to have insulation properties.

The extension portions $4t_1$ and $4t_2$ are formed by extending parts of the coil pattern $4a$ in a width direction of the board $3$. That is, the coil pattern $4a$ is formed integrally with the extension portions $4t_1$ and $4t_2$. The coil pattern $4a$ has a belt shape in parallel with a surface of the board $3$, and the coil pattern $4a$ is wound one turn around the projection $2m$ of the core $2a$. An end (positioned upward of the extension portion $4t_1$) of the coil pattern $4a$ is connected to the input electrode Ti illustrated in FIG. $1$. The through hole group $9a$ is provided at the other end of the coil pattern $4a$.

The heat dissipating pin $7b$, and the through hole $8d$ and the land $8c$ on the circumference of the heat dissipating pin $7b$ are provided at the center of the extension portion $4t_2$ of the coil pattern $4a$. The heat dissipating pin $7a$, and the through hole $8d$ and the land $8c$ on the circumference of the heat dissipating pin $7a$ are provided at one end of the heat dissipating pattern $5a$. The heat dissipating pin $7c$, and the through hole $8d$ and the land $8c$ on the circumference of the heat dissipating pin $7c$ are provided at the center of the heat dissipating pattern $5b$. The through hole group $9b$ is provided in the rectangular pattern $4d$.

The wiring patterns $6a$ and the pads $6b$ illustrated on the right and lower sides in FIG. $3$ form electrical circuits other than the magnetic device $1$. An electronic component $14a$ other than the magnetic device $1$ is surface-mounted on the pad $6b$ (also refer to FIG. $8$).

In FIGS. $7$ and $8$, only the thick electric conductors exist on the inner layer L2 close to the top surface layer L1 of the board $3$ as illustrated in FIG. $4$. The coil pattern $4b$, extension portions $4t_3$ and $4t_4$, a heat dissipating pattern $5c$, solid patterns $13d$ to $13h$, and the like are respectively formed on the thick electric conductors. The coil pattern $4b$ and the solid patterns $13d$ to $13h$ are individually formed, and are electrically connected to each other.

The extension portions $4t_3$ and $4t_4$ are formed by extending parts of the coil pattern $4b$ in the width direction. That is, the coil pattern $4b$ is formed integrally with the extension portions $4t_3$ and $4t_4$. The coil pattern $4b$ has a belt shape in parallel with the surface of the board $3$, and the coil pattern $4b$ is wound one turn around the projection $2m$ of the core $2a$. The through hole group $9a$ is provided at one end of the coil pattern $4b$. The through hole group $9b$ is provided at the other end of the coil pattern $4b$.

The heat dissipating pin $7c$, and the through hole $8d$ on the circumference of the heat dissipating pin $7c$ are provided at the center of the extension portion $4t_3$ of the coil pattern $4b$. The heat dissipating pin $7a$, and the through hole $8d$ on the circumference of the heat dissipating pin $7a$ are provided at one end of the extension portion $4t_4$. The heat dissipating pin $7b$, and the through hole $8d$ on the circumference of the heat dissipating pin $7b$ are provided at the center of the heat dissipating pattern $5c$. The through holes $11$ illustrated by the small-diameter white circles on the right and lower sides in FIG. $4$ are electrically connected to the coil pattern $4b$, the heat dissipating pattern $5c$, and the solid patterns $13d$ to $13h$.

In FIGS. $7$ and $8$, only the thin electric conductors exist on the inner layer L3 close to the back surface layer L4 of the board $3$ as illustrated in FIG. $5$. The thin electric conductors include solid patterns $13i$ to $13m$, a wiring pattern $6c$, and the like. The solid patterns $13i$ to $13m$ and the wiring pattern $6c$ are individually formed, and are electrically connected to each other. The heat dissipating pins $7a$ to $7c$ and the respective through holes $8d$ on the circumference of the heat dissipating pins $7a$ to $7c$ are electrically connected to the solid patterns $13i$ to $13m$ and the wiring patterns $6c$.

The through holes $11$ illustrated by the small-diameter white circles on the right and lower sides in FIG. $5$ are electrically connected to the solid patterns $13i$ to $13m$. The wiring patterns $6c$ form electrical circuits other than the magnetic device $1$.

As illustrated in FIG. $6$, the thick electric conductors and the thin electric conductors are mixed up on the back surface layer L4 of the board $3$. A coil pattern $4c$, extension portions $4t_5$ and $4t_6$, a rectangular pattern $4e$, heat dissipating patterns $5d$ to $5f$, a solid pattern $13o$, the land $8c$ of the through hole $8d$, and the like are respectively formed on the thick electric conductors. A wiring pattern $6d$, a solid pattern $13n$, a pad $6e$, and the like are respectively formed on the thin electric conductors. The solid pattern $13o$ may be formed on the thin electric conductor, and the solid pattern $13n$ may be formed on the thick electric conductor.

The coil pattern $4c$, the rectangular pattern $4e$, the heat dissipating patterns $5d$ to $5f$, the solid patterns $13n$ and $13o$, the wiring pattern $6d$, and the pad $6e$ are individually formed, and are electrically connected to each other.

The extension portions $4t_5$ and $4t_6$ are formed by extending parts of the coil pattern $4c$ in the width direction. That is, the coil pattern $4c$ is formed integrally with the extension portions $4t_5$ and $4t_6$. The coil pattern $4c$ has a belt shape in parallel with the surface of the board $3$, and the coil pattern $4c$ is wound one turn around the projection $2m$ of the core $2a$. The through hole group $9b$ is provided at one end of the coil pattern $4c$. The other end (positioned leftward from the extension portion $4t_6$) of the coil pattern $4c$ is connected to the output electrode To illustrated in FIG. $1$.

The heat dissipating pin $7a$, and the through hole $8d$ and the land $8c$ on the circumference of the heat dissipating pin $7a$ are provided at one end of the heat dissipating pattern $5d$. The heat dissipating pin $7b$, and the through hole $8d$ and the land $8c$ on the circumference of the heat dissipating pin $7b$ are provided at the center of the heat dissipating pattern $5e$. The heat dissipating pin $7c$, and the through hole $8d$ and the land $8c$ on the circumference of the heat dissipating pin $7c$ are provided at the center of the heat dissipating pattern $5f$. The through hole group $9a$ is provided in the rectangular pattern $4e$.

The wiring patterns $6d$ and the pads $6e$ illustrated on the right and lower sides in FIG. $6$ form electrical circuits other than the magnetic device $1$. An electronic component $14b$ other than the magnetic device $1$ is surface-mounted on the pad $6e$ (also refer to FIG. $8$).

As illustrated in FIGS. $3$ to $6$, the respective widths of the wiring patterns $6a$, $6c$, and $6d$ are respectively smaller than those of the coil patterns $4a$ to $4c$. As illustrated in FIGS. $7$ and $8$, the respective thicknesses of the wiring patterns $6a$, $6c$, and $6d$ are respectively smaller than those of the coil patterns $4a$ to $4c$.

Each of the coil patterns $4a$ to $4c$ is set to have a width, a thickness, or a cross-sectional area in such a manner that the amount of heat generated from the coil patterns $4a$ to $4c$ is suppressed to some extent even when a predetermined large current (for example, DC 150 A) flows through the coil patterns 4a to 4c, and the heat dissipates easily from the respective surfaces, while a predetermined performance of the coil is obtained.

The patterns 4a, 4b, and 4e are electrically connected to each other via the through hole group 9a, and pass through the different layers L1, L2, and L4, respectively. The patterns 4d, 4b, and 4c are electrically connected to each other via the through hole group 9b, and pass through the different layers L1, L2, and L4, respectively. Accordingly, the other end of the coil pattern 4a of the top surface layer L1 is electrically connected to one end of the coil pattern 4b of the inner layer L2 via the through hole group 9a. The other end of the coil pattern 4b is electrically connected to one end of the coil pattern 4c of the back surface layer L4 via the through hole group 9b.

That is, as illustrated by arrows in FIG. 3, the coil integrated with the board 3 starts from the input electrode Ti in FIG. 1 which is a starting point, and is first wound one turn around the projection 2m via the coil pattern 4a of the top surface layer L1, and then is connected to the inner layer L2 via the through hole group 9a. Subsequently, as illustrated by arrows in FIG. 4, on the inner layer L2, the coil is secondly wound one turn around the projection 2m via the coil pattern 4b, and then is connected to the back surface layer L4 via the through hole group 9b. As illustrated by arrows in FIG. 6, on the back surface layer L4, the coil is thirdly wound one turn around the projection 2m via the coil pattern 4c, and then is connected to the output electrode To in FIG. 1 which is an end point. In this manner, the coil forms a continuous current route of the coil in which the input electrode Ti, the coil pattern 4a, the through hole group 9a, the coil pattern 4b, the through hole group 9b, the coil pattern 4c, and the output electrode To are connected in series to each other in the sequence.

The small-diameter through holes 11 pass through two or more layers among the top surface layer L1, the inner layer L3, and the back surface layer L4. The wiring patterns 6a, 6c, and 6d are electrically connected to each other via the through holes 11, and pass through the different layers L1, L3, and L4, respectively.

The heat dissipating pin 7a, and the through hole 8d and the land 8c on the circumference of the heat dissipating pin 7a are thermally connected to the heat dissipating pattern 5a, the extension portion $4t_4$ of the coil pattern 4b and the heat dissipating pattern 5d which pass through the different layers L1, L2, and L4, respectively. The heat dissipating pin 7b, and the through hole 8d and the land 8c on the circumference of the heat dissipating pin 7b are thermally connected to the extension portion $4t_2$ of the coil pattern 4a and the heat dissipating patterns 5c and 5e which pass through the different layers L1, L2, and L4, respectively. The heat dissipating pin 7c, and the through hole 8d and the land 8c on the circumference of the heat dissipating pin 7c are thermally connected to the heat dissipating pattern 5b, the extension portion $4t_3$ of the coil pattern 4b and the heat dissipating pattern 5f which pass through the different layers L1, L2, and L4, respectively.

For this reason, even when a large current flows through the coil patterns 4a to 4c via the above-mentioned current route, heat generated from the coil pattern 4a of the top surface layer L1 diffuses to the extension portions $4t_1$ and $4t_2$, and dissipates from a surface of the coil pattern 4a or the respective surfaces of the extension portions $4t_1$ and $4t_2$. The heat generated from the coil pattern 4a transfers to the heat dissipating pin 7b, and the through hole 8d and the land 8c on the circumference of the heat dissipating pin 7b. Then, the heat diffuses to the heat dissipating pattern 5e of the back surface layer L4, and dissipates from a surface of the heat dissipating pattern 5e to the heat sink 10 via the insulation sheet 12.

Heat generated from the coil pattern 4b of the inner layer L2 transfers to the heat dissipating pins 7a and 7c, the respective through hole 8d and land 8c on the circumference of the heat dissipating pins 7a and 7c, and the through hole groups 9a and 9b and dissipates to the heat dissipating patterns 5a and 5d on the top surface layer L1 and the heat dissipating patterns 5d and 5f on the back surface layer L4. Then, the heat diffuses to the heat dissipating patterns 5a and 5b of the top surface layer L1 or the heat dissipating patterns 5d and 5f of the back surface layer L4. The heat dissipates from the respective surfaces of the heat dissipating patterns 5a and 5b of the top surface layer L1, and the heat dissipates from the respective surfaces of the heat dissipating patterns 5d and 5f of the back surface layer L4 to the heat sink 10 via the insulation sheet 12. The through hole groups 9a and 9b function as thermal vias.

Heat generated from the coil pattern 4c of the back surface layer L4 diffuses to the extension portions $4t_5$ and $4t_6$, and dissipates from a surface of the coil pattern 4c or the respective surfaces of the extension portions $4t_5$ and $4t_6$ to the heat sink 10 via the insulation sheet 12.

In the embodiment, the thick electric conductors and the thin electric conductors are mixed up on the top surface layer L1 and the back surface layer L4 which are the outer layers of the board 3. The one inner layer L2 is provided with only the thick electric conductors, and the other inner layer L3 is provided with the thin electric conductors. The coil patterns 4a to 4c, each having a large thickness and a large cross-sectional area, are formed on the thick electric conductors which are respectively provided on the top surface layer L1, the inner layer L2, and the back surface layer L4. For this reason, it is possible to provide three turns of coil in three of the four layers of the board 3 while suppressing generation of heat from the coil.

The wiring pattern 6a and the land 6b, and the wiring pattern 6d and the land 6e are respectively formed on the thin electric conductors that are respectively provided on the top surface layer L1 and the back surface layer L4. Each of the wiring patterns 6a and 6d and the lands 6b and 6e has a width or a thickness which is smaller than that of the coil patterns 4a to 4c. For this reason, it is possible to mount the electronic components 14a and 14b on the top surface layer L1 and the back surface layer L4 of the board 3 at a high density, and form the electrical circuits thereon at a high density. Similarly, it is possible to mount the electronic components at a high density even on the thin electric conductors that are provided in the portions other than portion A of each of the top surface layer L1 and the back surface layer L4 of the board 3, and form the electrical circuits thereon at a high density (not illustrated).

The wiring pattern 6c is formed on the thin electric conductor of the inner layer L3, and has a width or a thickness which is smaller than that of the coil patterns 4a to 4c. For this reason, it is possible to form the electrical circuits on the inner layer L3 of the board 3 at a high density. Similarly, it is possible to form the electrical circuits at a high density even on the thin electric conductors that are provided in the portions other than portion A of the inner layer L3 of the board 3 (not illustrated).

Since it is possible to mount the electronic components and the electrical circuits on the three layers L1, L3, and L4 of the board 3 at a high density, it is possible to reduce the size of the board 3 and the switching power supply apparatus 100.

Since the one inner layer L2 is provided with only the thick electric conductors, and the other inner layer L3 is provided with only the thin electric conductors, it is possible to reduce the number of formation steps of the inner layers L2 and L3. Since the board 3 is a printed board having an even number of layers (the four layers in the embodiment), it is possible to manufacture the board 3 easier than a board having an odd number of layers. As a result, it is possible to easily manufacture the board 3.

The present invention can adopt various embodiments other than the embodiment. For example, in the embodiment, the coil patterns 4a to 4c of one turn are respectively formed on the top surface layer L1, the inner layer L2, and the back surface layer L4 of the board 3, but the present invention is not limited to that of the embodiment. The number of turns of the coil pattern in each layer of the board may be one, or two or more. The number of turns of the coil pattern may be different between the layers. The coil pattern may be formed on any one of the top surface and back surface layers of the board, and may be formed on the entirety of the inner layers. The present invention can be applied to a multiple layer printed board with three layers or five or more layers.

In the embodiment, the respective coil patterns 4a to 4c of the different layers L1, L2, and L4 are electrically connected to each other via the through hole groups 9a and 9b, but the present invention is not limited to that of the embodiment. Alternatively, the respective coil patterns of the different layers may be connected to each other via connecting means such as a single through hole, a pin, or a terminal.

In the embodiment, the I-shaped lower core 2b is combined with the E-shaped upper core 2a, however, the present invention can be applied to the magnetic device in which two E-shaped cores are combined together.

The embodiment is an example in which the present invention is applied to the magnetic device 1 used as the choke coil L of the smoothing circuit 55 in the switching power supply apparatus 100 for a vehicle, and the board 3 on which the parts of the switching power supply apparatus 100 are mounted. For example, the present invention can be applied to the magnetic device used as the transformer 53 (refer to FIG. 1) or the board on which a part of the switching power supply apparatus 100 is mounted. For example, the present invention can be applied to the magnetic device used in the switching power supply apparatus for electronic equipment other than a vehicle, or the board for the magnetic device.

While the invention has been described with reference to a limited number of embodiments, those skilled in the art, having benefit of this disclosure, will appreciate that other embodiments can be devised which do not depart from the scope of the invention as disclosed herein. Accordingly, the scope of the invention should be limited by the attached claims.

What is claimed is:

1. A coil-integrated printed circuit board comprising:
a first outer layer which comprises a first outer thick electric conductor made of a thick metallic foil and a first outer thin electric conductor made of a thin metallic foil having a thickness smaller than that of the first outer thick electric conductor, and which is exposed to an outside;
a first inner layer which comprises an inner thick electric conductor made of a thick metallic foil, and which is not exposed to the outside; and
a second outer layer which comprises a second outer thick electric conductor made of a thick metallic foil and a second outer thin electric conductor made of a thin metallic foil having a thickness smaller than that of the second outer thick electric conductor, and which is exposed to an outside,
wherein coil patterns are respectively formed by the first outer thick electric conductor and the inner thick electric conductor,
wherein a first electronic component is surface-mounted on the first outer thin electric conductor provided on the outer layer,
wherein the first outer layer defines one of a top surface and a back surface of the coil-integrated printed circuit board, and the second outer layer defines the other of the top surface and the back surface,
wherein the first inner layer is disposed between the first outer layer and the second outer layer, and comprises the inner thick electric conductor without a thin electric conductor made of a thin metallic foil,
wherein the coil patterns are respectively formed by the first outer thick electric conductor, the second outer thick electric conductor and the inner thick electric conductor, and
wherein a second electronic component is surface-mounted on the second outer thin electric conductor.

2. The coil-integrated printed circuit board according to claim 1, further comprising:
a second inner layer disposed between the first outer layer and the second outer layer, and which comprises an inner thin electric conductor without a thick electric conductor made of a thick metallic foil, and
wherein a wiring pattern is formed by the inner thin electric conductor.

3. A magnetic device comprising:
the coil-integrated printed circuit board according to claim 2; and
a core which is made of a magnetic material and which passes through the coil-integrated printed circuit board,
wherein the coil patterns formed in the coil-integrated printed circuit board are wound around the core.

4. A magnetic device comprising:
the coil-integrated printed circuit board according to claim 1; and
a core which is made of a magnetic material and which passes through the coil-integrated printed circuit hoard,
wherein the coil patterns formed in the coil-integrated printed circuit board are wound around the core.

5. A magnetic device comprising:
a coil-integrated printed circuit board; and
a core which is made of a magnetic material and which passes through the coil-integrated printed circuit board,
wherein the coil-integrated printed circuit board comprises:
a first outer layer which comprises a first outer thick electric conductor made of a thick metallic foil and a first outer thin electric conductor made of a thin metallic foil having a thickness smaller than that of the first outer thick electric conductor, and which is exposed to an outside; and
a first inner layer which comprises an inner thick electric conductor made of a thick metallic foil, and which is not exposed to the outside;
wherein coil patterns are respectively formed by the first outer thick electric conductor and the inner thick electric conductor,
wherein a first electronic component other than the core is surface-mounted on the first outer thin electric conductor provided on the first outer layer, wherein the coil patterns formed in the coil-integrated printed circuit board are wound around the core.

* * * * *